United States Patent
Matsuo

(10) Patent No.: US 7,053,456 B2
(45) Date of Patent: May 30, 2006

(54) ELECTRONIC COMPONENT HAVING MICRO-ELECTRICAL MECHANICAL SYSTEM

(75) Inventor: Mie Matsuo, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/857,926

(22) Filed: Jun. 2, 2004

(65) Prior Publication Data
US 2005/0218488 A1    Oct. 6, 2005

(30) Foreign Application Priority Data
Mar. 31, 2004   (JP)   ............... P2004-106204

(51) Int. Cl.
*H01L 29/82* (2006.01)
(52) U.S. Cl. ............... 257/415; 257/417; 257/418; 257/420
(58) Field of Classification Search ............... 257/415, 257/417, 418, 420; 438/48–53; 73/777–780; 361/283.1–3
See application file for complete search history.

(56) References Cited

U.S. PATENT DOCUMENTS

| 6,074,890 A | 6/2000 | Yao et al. ............... 438/52 |
| 6,228,675 B1 | 5/2001 | Ruby et al. ............... 438/106 |
| 6,674,159 B1 * | 1/2004 | Peterson et al. ............. 257/680 |
| 2003/0107456 A1 * | 6/2003 | Nishihara et al. ............ 333/187 |

FOREIGN PATENT DOCUMENTS

JP        40518794   *  7/1993

* cited by examiner

*Primary Examiner*—Eddie Lee
(74) *Attorney, Agent, or Firm*—Finnegan, Henderson, Farabow, Garrett & Dunner, L.L.P.

(57) ABSTRACT

An electronic component includes a semiconductor substrate having a first surface and a second surface opposite to the first surface, a cavity that penetrates from the first surface to the second surface of the semiconductor substrate, and an electrical mechanical element that has a movable portion formed above the first surface of the semiconductor substrate so that the movable portion is arranged above the cavity. The electronic component further includes an electric conduction plug, which penetrates from the first surface to the second surface of the semiconductor substrate, and which is electrically connected to the electrical mechanical element.

16 Claims, 11 Drawing Sheets

ELECTRONIC COMPONENT HAVING MICRO-ELECTRICAL MECHANICAL SYSTEM

CROSS REFERENCE TO RELATED APPLICATIONS

This application is based upon and claims the benefit of priority from the prior Japanese Patent Application No. 2004-106204 filed on Mar. 31, 2004, the entire contents of which are incorporated herein by reference.

BACKGROUND OF THE INVENTION

1. Field of the Present Invention

This invention relates to an electronic component, and an electronic component module, including a MEMS (Micro-Electrical Mechanical System) which is a micro device having an electric function and a mechanical function, and to a method of manufacturing the electronic component.

2. Description of the Related Art

An electronic component having a micro electrical mechanical element has been developed. (Hereinafter, the electronic components and the micro electrical mechanical element are referred to as "MEMS electronic components" and a "MEMS element" respectively.) There have been recent active studies of the MEMS electronic components that use a manufacturing process of Si chips where integrated electric circuits are formed. Generally, the MEMS element has a movable portion since the device involves a mechanical movement. When forming the MEMS element on a semiconductor substrate, such as a Si chip, therefore, it is necessary to form a space for motion around the movable portion of the MEMS element so as to not hinder the mechanical movement.

Two processes of manufacturing a MEMS element have been known. One is a method of forming a sacrifice layer such as a poly silicon, a silicon oxide, metal, and an organic layer on a Si substrate, and forming the movable space in the sacrifice layer. This process is referred to as a "Surface MEMS process." Another process is referred to as a "bulk (Bulk) MEMS process" in which the movable space is formed in the Si substrate itself.

With regard to the "Surface MEMS process," after forming the MEMS element on the sacrifice layer, the sacrifice layer in a region corresponding to the movable portion of the MEMS element is removed by etching to form the space for movement. In this process, since the size of the space for movement of the MEMS element is restricted by the thickness of the sacrifice layer, there is little freedom for the design. On the other hand, in the "Bulk MEMS process", since the Si substrate in the region corresponding to the movable portion is removed from a lower surface of the Si substrate by etching to make a cavity after forming the MEMS element on the Si substrate, a larger space for movement for the MEMS can be prepared.

However, when etching a single crystal Si substrate, the etching rate differs depending on crystal planes thereof. When etching a generally-used Si substrate having a crystal face of (100), a cavity with an etching slope at an angle of 54.7 degrees to the surface of the substrate (i.e., a surface of the slope has a crystal face (111)) will be formed. For this reason, in order to form an opening with a predetermined size in an upper surface (or a main surface) of the substrate, it is inevitable that a considerably large opening is formed in the lower surface of the substrate. Consequently, with regard to the "Bulk MEMS process" where the Si substrate is etched from the lower surface thereof, it is difficult to form the opening in a predetermined size in a predetermined position in the upper surface of the substrate accurately. In addition, since a cavity larger than necessary is formed in the Si substrate, it is difficult to keep the mechanical strength of the Si substrate.

Further, in conventional electronic component modules having the MEMS element, wire bonding is generally used as a lead line for mounting a chip on a printed circuit board. However, when using a component called an RF-MEMS, which is used in the communication field (a switch, a filter, a variable inductor, a variable capacity, an antenna, etc.), there are cases where a parasitic capacitance and inductance are caused by the wire bonding and thus the intended performance cannot be attained.

Furthermore, when packaging the MEMS electronic component, it is necessary to provide a movable space above the MEMS element additionally. Thus, unlike conventional general-purpose packages, resin molding cannot be performed. Consequently, a process of mounting ceramic-packages, wherein an expensive hermetic sealing is performed and which is different from processes of mounting components, such as other circuit chips including LSI, etc., is mainly used. Because of the inconsistency between the mounting processes, it is difficult to manufacture an SIP (System In Package), wherein an MEMS element and other circuit chips are integrated in one package, and thus the MEMS element is usually mounted on a board as an isolated device.

SUMMARY OF THE INVENTION

An electronic component according to a first embodiment of the present invention includes a semiconductor substrate having a first surface and a second surface opposite to the first surface, a cavity that penetrates from the first surface to the second surface of the semiconductor substrate, and an electrical mechanical element that has a movable portion formed above the first surface of the semiconductor substrate so that the movable portion is arranged above the cavity. The electronic component further includes an electric conduction plug, which penetrates from the first surface to the second surface of the semiconductor substrate, and which is electrically connected to the electrical mechanical element.

An electronic component module according to a second embodiment of the present invention includes the electronic component according to the first embodiment and a circuit chip stacked on the electronic component with a spacer interposed in-between.

An electronic component module according to a third embodiment of the present invention includes: a circuit board including a wiring pattern, the electronic component according to the first embodiment and an electric conduction bump which electrically connects the electric conduction plug of the electronic component to the wiring pattern of the circuit board, and which is arranged between the electronic component and the circuit board.

A method of manufacturing an electronic component according to a forth embodiment of the present invention includes: forming a trench from a side of a first surface of the semiconductor substrate, burying a sacrifice film in the trench, forming an electrical mechanical element having a movable portion above the first surface of the semiconductor substrate so that the movable portion is arranged above the main trench. The method further includes grinding the semiconductor substrate from a side of a second surface of the semiconductor substrate, which is opposite to the first surface, to expose the sacrifice film, and forming a cavity inside of the trench by removing the sacrifice film from the second surface.

DETAILED DESCRIPTION OF THE EMBODIMENTS

Figure 1:
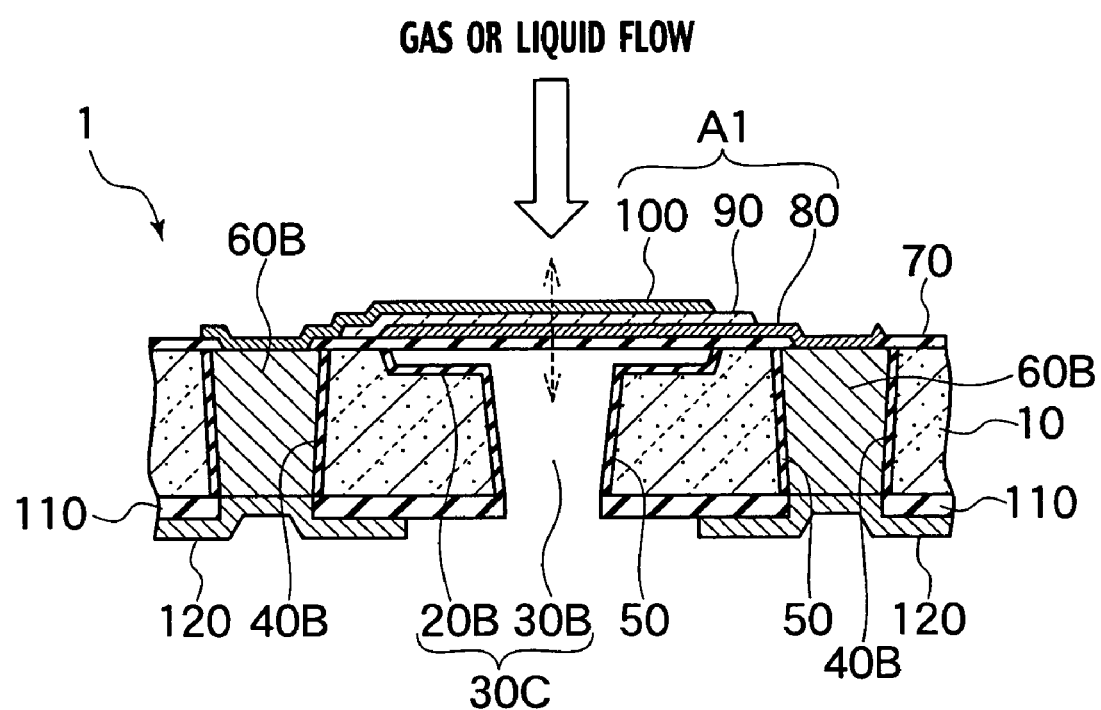
FIG. 1 is a cross sectional view showing a structure of an MEMS electronic component according to a first embodiment of the present invention.

Hereinafter, an MEMS electronic component and a manufacturing method thereof according to embodiments of the present invention will be described with reference to the drawings.

First Embodiment

In FIG. 1A, a structure of an MEMS electronic component 1 according to the first embodiment is shown. As shown in FIG. 1A, the MEMS electronic component 1 according to the first embodiment includes an MEMS element (an electrical mechanical element) A1, which has a movable portion in an upper surface (or a first electrode) of a silicon substrate 10. The first embodiment illustrates a piezoelectric device, as the MEMS element A1, which can be used as a thin film bulk acoustics resonator (FBAR), various sensors, etc. The piezoelectric device has a structure where a piezo-electric film 90 is sandwiched between the upper electrode 100 and a lower electrode (or a second electrode) 80. The piezoelectric film 90 moves in the vertical direction shown by a broken-line arrow, and in the in-planar direction of the substrate plane.

The MEMS electronic component 1 according to the first embodiment has a cavity 30C, which penetrates from an upper surface (or a first surface) to a lower surface (or a second surface) of a silicon substrate 10. The MEMS element A1 is formed in the upper surface of the silicon substrate 10 so that a movable portion is arranged above the cavity 30C. Moreover, the MEMS electronic component 1 has an electric conduction plug 60B, which penetrates from the upper surface to the lower surface of the silicon substrate 10.

The electric conduction plug 60B can be used as an electrode lead of the lower electrode 80 and the upper electrode 100 in the MEMS element A1. Thus, with regard to the MEMS electronic component 1 according to the first embodiment, the electrode lead of the MEMS device A1 enables a module which does not need the conventional wire bonding to be formed.

Moreover, a cavity 30B can be formed using a process of forming the electric conduction plug 60B, as will be described hereinafter. The cavity 30C has an opening area so wide that the movable space for the MEMS element A1 is secured in particular at the upper surface of the substrate, and has a narrower opening area at the lower surface side of the substrate. Accordingly, a cavity with an unnecessarily large size is not formed in the silicon substrate 10. For this reason, this silicon substrate has higher strength than one manufactured in the conventional "Bulk MEMS process." Note that an "opening area" is defined as being an area expressed by the cross section, of the opening of the cavity or the trench, taken in parallel to the upper or lower surface of the substrate. When simply referred to as an "opening area," it means a maximum area of openings of a cavity or a trench.

More specifically, in the MEMS electronic component 1, the lower electrode 80, the piezo-electric film 90 and the upper electrode 100 are laminated on the upper surface of the silicon substrate 10, with an insulation film 70 such as $SiO_2$ film interposed in-between. The materials that can be used for the lower electrode 80 and the upper electrode 100 include: Pt, Sr, Ru, Cr, Mo, W, Ti, Ta, Al, Cu, Ni; a nitride with one of these, and a conductive oxide with one of these (for example, SrRuO); a compound of materials selected from these; and a layered material selected from these. The end of each electrode is drawn out, and is connected with the electric conduction plug 60B. The materials that can be used as a piezo-electric film 90 include a ceramic piezo-electric-crystal material, such as PZT ($Pb(Zr,Ti)O_3$), BTO ($BaTiO_3$), AlN, ZnO and the like as well as PVDF (poly fluoride vinylidene).

Furthermore, the cavity 30C has a shallow cavity 20B (a first cavity region) with a large opening area in the place close to the movable portion of the MEMS element on the side of the upper surface of the substrate. In addition, the cavity 30C has a cavity 30B (a second cavity region) with a narrow opening area, which penetrates from the bottom of the cavity 20B to the lower surface of the silicon substrate 10. The cavity 20B has a depth of several micrometers to 10 µm, preferably approximately 5 µm or more, and a depth and an opening area sufficient for securing the space for movement of the MEMS element A1. In other words, in the cavity part close to the MEMS element A1, a space required for the movement of the MEMS element A1 is secured, whereas the other part is formed with a relatively narrow cavity. Moreover, as will be described later, the cavity 30C and the electric conduction plug 60B are formed in a common step. For this reason, the opening area in the lower surface of the substrate is narrower than the opening area in the upper surface of the substrate because of the influence of anisotropic etching to be carried out from the upper surface of the substrate. Accordingly, the size of the cavity formed in the silicon substrate 10 is restricted, and thus the mechanical strength of the silicon substrate 10 can be kept.

The electric conduction plug 60B penetrates through the silicon substrate 10 between the upper and lower surface thereof, and is formed by burying a through-hole 40B, whose inner wall surface is coated with an oxide film 50, with a conductive material, such as copper (Cu). In addition, the inner wall surface of the cavity 30C is coated with the oxide film 50. An electrode pad 120 is formed on each electric conduction plug 60B that is exposed to the lower surface of the silicon substrate 10. Furthermore, the lower surface of the silicon substrate 10, except for the electrode pad 120 and the electric conduction plug 60B, are coated with an insulation film 110.

In the MEMS electronic component 1 according to the first embodiment, the electrode of the MEMS element A1 is connected to the electric conduction plug 60B, and, further, the electrode pad 120 is formed on the lower surface of the substrate. For this reason, a bump and the like can be used for the electric connection with external components. Therefore, the generating of a parasitic capacitance and inductance, which would be caused in the lead wire when using the wire bonding, can be prevented.

Next, with reference to FIG. 2A to FIG. 2F, a method of manufacturing the MEMS electronic component according to the first embodiment will be described.

Figure 2A:
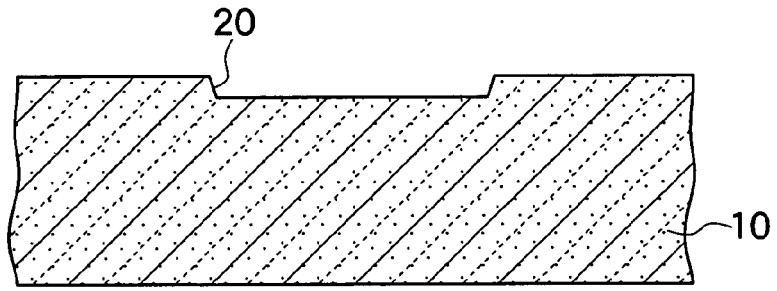
FIGS. 2A to 2F are cross sectional views showing each step of a method of manufacturing the MEMS electronic component according to the first embodiment of the present invention.

First, as shown in FIG. 2A, the silicon substrate 10 with a thickness, for example, of approximately 750 μm is prepared. Then, anisotropic etching is performed on the upper surface by using reactive ion etching (RIE) and the like, and a shallow trench 20 is formed. The trench 20 is formed in a region where the movable portion of the MEMS element is formed. With regard to the size of the trench, the trench has a sufficiently large area for the movable portion of the MEMS element. Although there are no constrains on the shape thereof, it is possible that the trench can be shaped, for example, like a rectangle with one side approximately 150 μm in length. The depth of the trench 20 is set to be no less than several micrometers, preferably no less than 5 μm, in order to secure a sufficient movable distance without hindering the movement of the MEMS element A1.

Figure 2B:
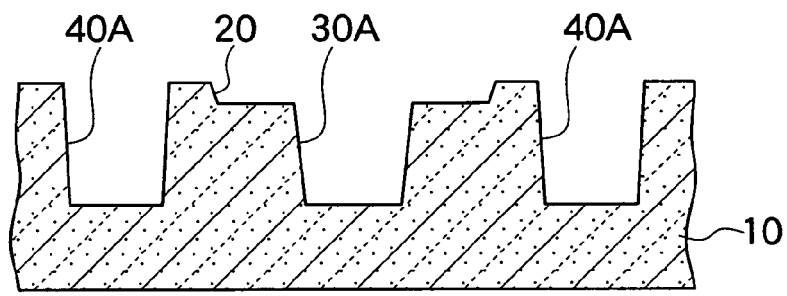

Next, as shown in FIG. 2B, trenches 30A and 40A, respectively, are formed in the bottom of the previously formed shallow trench 20 and in the position where the electric conduction plugs are to be formed, by an anisotropic etching using a RIE with a fluorine system gas, such as $SF_6$. The size of the trench 30A is not necessarily restrained. However, it is preferable that the size thereof is so large that the etching is easily carried out, in the subsequent step, when etching the electric conduction film buried inside the trench. The size of the trench 30A may be almost the same as that of the trench 40A which is formed for the electric conduction plug. In this case, the etching depths of the trench 40A and the trench 30A can be made almost the same. For example, the opening of the trench in the upper surface of the substrate is set at approximately 30 μm φ, and the etching is carried out to the depth of approximately 50 μm–200 μm, more preferably to approximately 70 μm–100 μm. In addition, since this depth will be the thickness of the substrate of the MEMS chip that is finally obtained, it is preferable that such a depth is determined so that the required mechanical strength is obtained.

Figure 2C:
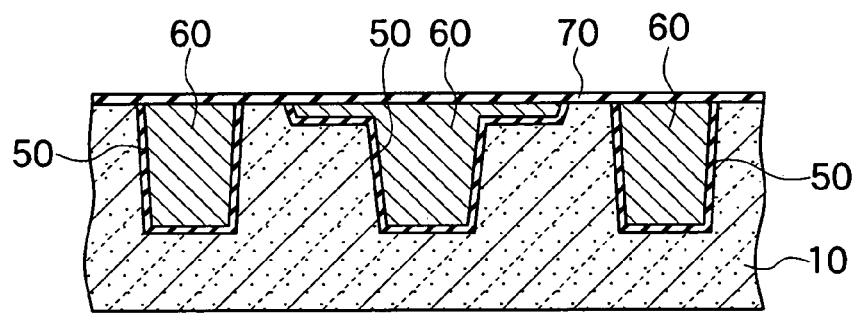

Then, an oxide film is formed on the inner wall surface of the trenches 20, 30A and 40A using a thermal-oxidation method. Subsequently, the trenches 20, 30A and 40A are each buried with an electric conduction film 60. As the electric conduction film 60, for example, copper (Cu), silver (Ag), aluminum (Al), or an alloy of these can be used. When using Cu, a barrier metal and a Cu film are first formed thinly on the inner wall surface of each trench by sputtering and the like for the purposes of preventing diffusion and improving adhesion. Then, the Cu film formed by sputtering is used as a seed layer, and the inside of each trench is buried with Cu by an electroplating method. Next, the upper surface of the silicon substrate 10 is leveled using a CMP (chemical machinery polishing) method, and further an insulation film 70 is formed on the upper surface of the substrate using a CVD and the like. Thus, a structure shown in FIG. 2C is obtained.

Figure 2D:
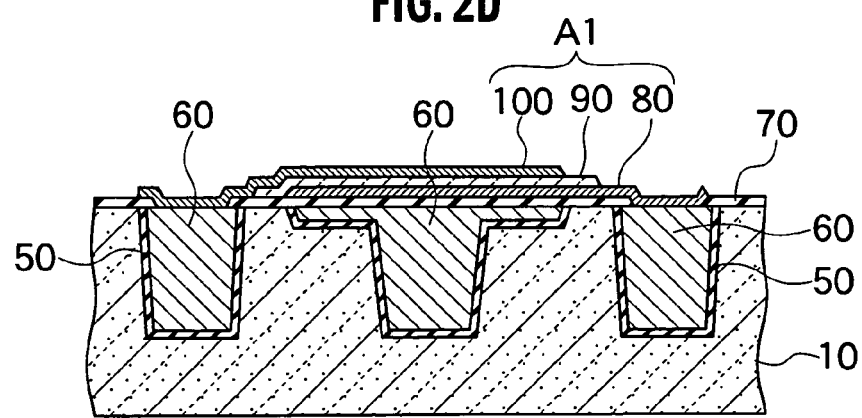

Then, as shown in FIG. 2D, the MEMS element A1 is formed on the upper surface of the silicon substrate 10. Specifically, the insulation film 70 formed on the silicon substrate 10 is first selectively etched using an RIE and the like, and the electric conduction film 60 which is buried in each trench 40A is exposed to be an electric conduction plug. Next, a film of metal, such as tungsten (W) and molybdenum (Mo), is formed on the upper surface of the substrate by sputtering and the like. Subsequently, necessary patterning is carried out by a photolithography process to form the lower electrode 80 which is connected to the electric conduction film 60 that is buried in one of the trench 40A. Next, a piezo-electric film 90 is formed. The materials that can be used as the piezo-electric film include an aluminum nitride (AlN), a lead zirconate titanate (PZT) and a zinc oxide (ZnO), which exhibit various piezo-electric characteristics. When forming a PZT film, for example, a film with a thickness of approximately 200 nm is formed using a sputtering method and the like. Then, a device pattern is formed on the shallow trench 20 using a photolithography process. For example, the etching of the PZT film is carried out using an RIE with a mixed gas of chlorine, oxygen, argon, nitrogen, boron chloride and the like as the etching gas. Then, the upper electrode 100, which is to be connected to the electric conduction film 60 that is buried in the other trench 40A, will be formed under the same conditions as the lower electrode 80.

Figure 2E:
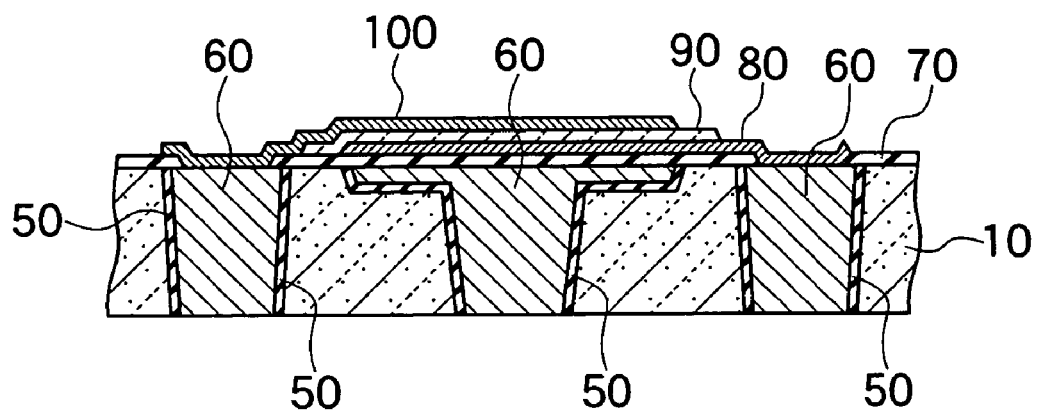

Next, as shown in FIG. 2E, the silicon substrate 10 is ground from the lower surface to expose the electric conduction film 60, which buries each of the trenches 30A and 40A. In this way, each trench is made to be a through-hole that penetrates through the substrate between the upper and lower surfaces thereof.

Figure 2F:
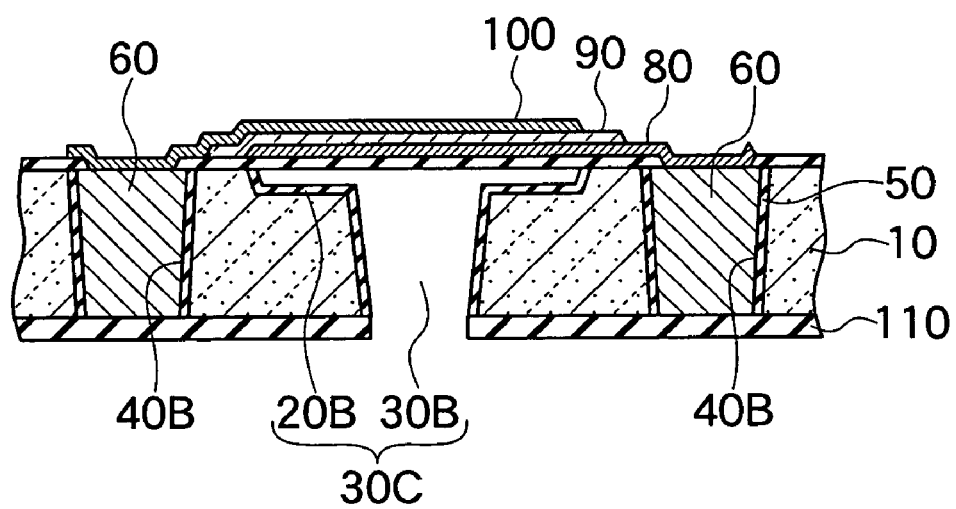

Then, the insulation film 110 is formed on the lower surface of the substrate. Subsequently, only the electric conduction film 60 inside the trench 30A is exposed by selectively etching. Then, the cavity 30C shown in FIG. 2F is formed by etching the electric conduction film 60 buried in through-holes 20B and 30B, by wet etching. When Cu is used as the electric conduction film 60, the etching is carried out with a mixed-solution of hydrochloric acid and hydrogen-peroxide water, or with a sulfuric acid and the like. Then, the insulation-film 110 formed on the lower surface of the substrate is so selectively etched that the electric conduction film 60 in each through-hole 40B is exposed. Further, an electric conduction film of gold (Au) and the like is formed on the lower surface of the substrate, and through a photolithography process, an electrode pattern 120, which is electrically connected to the electric conduction film 60 in each through-hole 40B, is formed. Accordingly, the electric conduction film 60 in each through-hole 40B is made to be the electric conduction plug 60B that is connected to each electrode of the MEMS device A1. Eventually, the MEMS electronic component 1 according to the first embodiment shown in FIG. 1 is completed.

In addition, it is preferable that when grinding the silicon substrate 10 from the lower surface, the trenches have been formed in advance from the upper surface of the silicon substrate by dicing, such chips can be divided when completing the grinding. This is because the following problem can be avoided. If the dicing is carried out after forming the cavity 30C, shavings produced in the dicing process easily come into the cavity, which will cause a lowering of the yield. If the dicing is carried out before forming the cavity 30C, such a problem can be avoided.

Moreover, in etching the electric conduction film in order to form the cavity 30C, the electrode pad of each electric conduction plug may be formed in advance using a metal, such as Au, having a high etching-proof nature against the etchant of Cu, and may be etched thereafter by a solution containing sulfuric acid and the like.

According to the method of manufacturing the MEMS electronic component 1 of the first embodiment described above, it is easy to determine the size and the position of the space for movement, since the trench 20, which becomes the space for movement of the MEMS element A1, is formed on the upper surface side of the silicon substrate 10. Moreover, the opening area of the trench 30A, which is eventually made to penetrate to the lower surface of the substrate, can be formed sufficiently small compared with the space for movement. Moreover, the cavity 30C, which is wider towards the side of the upper surface of the substrate and narrower towards the side of the lower surface of the substrate, can be formed by anisotropic etching. Consequently, since the size of the cavity 30C can be restricted, the mechanical strength of the silicon substrate 10 can be maintained. Moreover, since the process of manufacturing the electric conduction plug 60B, which is to be the lead electrode of the MEMS element A1, can be proceeded concurrently, the load on the process is light.

Figure 3:
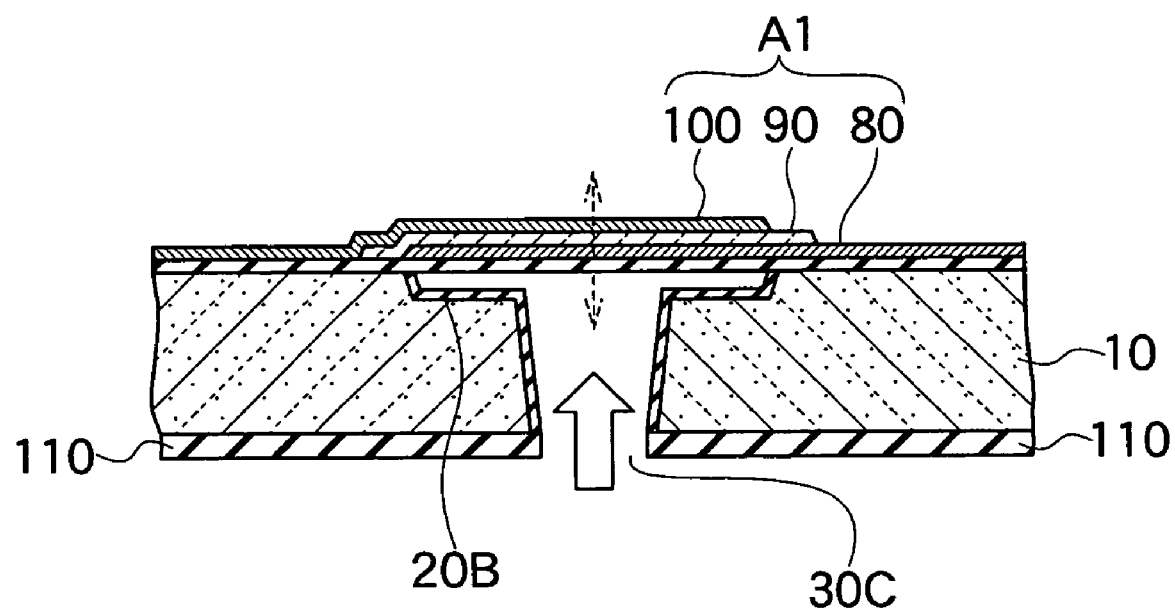
FIG. 3 is a cross sectional view showing an example of a modification in the MEMS electronic component according to the first embodiment of the present invention.

FIG. 3 is a cross sectional view showing an example of a modification in the MEMS electronic component according to the first embodiment. FIG. 1 and FIG. 2A to FIG. 2F show the MEMS electronic component having the electric conduction plug. Depending on the operating conditions, however, there may be cases where the electric conduction plug is not necessarily required. In such a case, a structure omitting the electric conduction plug, as shown in FIG. 3, may be employed. In this case, when forming the cavity 30C, the shallow trench 20 and the deep trench 30A are formed first, as in the above described manufacturing method, and then the trench is buried with the sacrifice film that is not limited to the electric conduction film. Subsequently, the MEMS element is formed above the trench 20. Then, the silicon substrate 10 is ground from the lower surface to expose the buried sacrifice film, and then the cavity 30C consisting of the shallow cavity 20B and the deep cavity 30B is formed by etching the sacrifice film. The sacrifice film is not limited to the electric conduction film, as any film which has a high ratio of selectivity for etching to the oxide film or the silicon substrate 10 can be used. In this case, too, since the size of the cavity 30C can be restricted as a whole, the mechanical strength of the silicon substrate 10 can be maintained.

Figure 4A:
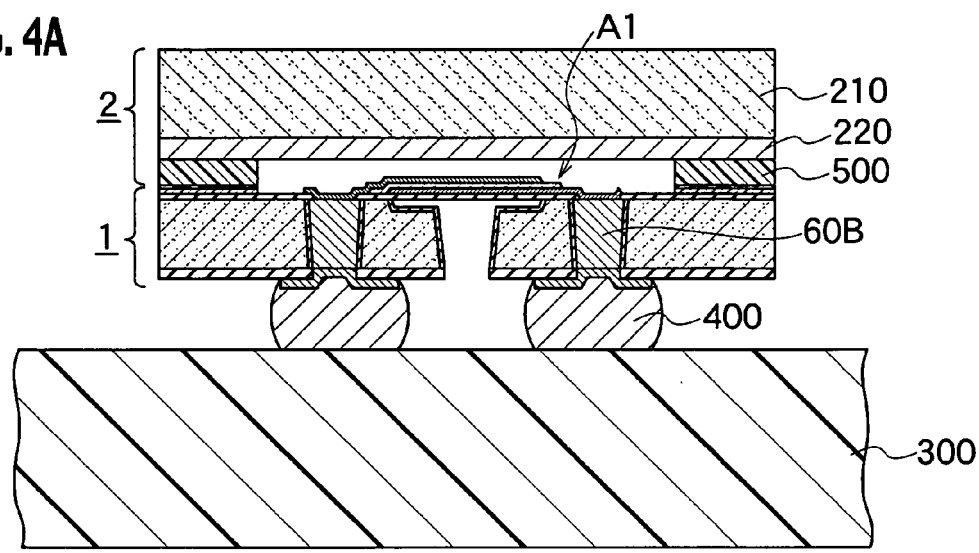
FIG. 4A and FIG. 4B are cross sectional views showing a module, where the MEMS electronic component and an LSI chip are stacked, according to the first embodiment of the present invention.

FIG. 4A shows an example of a stacked module, where the MEMS electronic component (MEMS chip) 1 according to the first embodiment is mounted on a printed circuit board together with other circuit chips. Note that, in this drawing, the electric wiring except for the MEMS element is conveniently omitted. As shown in this drawing, since the MEMS electronic component 1 according to the first embodiment is provided with an electric conduction plug 60B, which brings out the electrode of the MEMS element A1 to the lower surface of the substrate, the electric connection to a circuit pattern of a circuit board 300 can be made using an electric conduction bump 400. Moreover, since the direct connection can be made by the electric conduction bump 400 without using wire bonding for the connection to the circuit board 300, the electric-wiring distance can be shortened. If the MEMS element A1 is an RF-MEMS element that uses a high frequency signal, the influence of noise can be suppressed and the performance of the element can thus be improved.

Moreover, since the MEMS chip 1 and another LSI chip 2, such as a baseband LSI and an RF circuit LSI, can be easily stacked and integrated with a spacer 500 and the like interposed in-between, the miniaturization and the reduction in weight of the module can be attained.

Furthermore, as shown in FIG. 4A, if the ring-shaped spacer 500 is arranged in the area surrounding both chips, and if the MEMS chip 1 and the LSI chip 2 are stacked in layers so that the surface of the MEMS chip 1, facing the MEMS element A1, and an element formation layer 220 formed on the silicon substrate 210 of the LSI chip 2 are caused to be opposite to each other with this spacer 500 interposed in-between, the area surrounding space for movement of the MEMS element A1 can be sealed by the spacer 500. While a resin encapsulation is carried out, the resin can be blocked from passing through into the space, above the MEMS element A1, which is assigned as the movable portion. Thus, the space formed between the two chips can be used as the space for movement. Consequently, since it is not necessary to use a conventional, expensive hermetic sealing, the product cost can be significantly reduced. In addition, materials having a sealing characteristic may be used as the spacer 500. Metal materials that can be preferably used include especially a low-melting-point metal such as a solder as well as a resin material such as polymide, benzo-cyclo-butane (BCB), and epoxy.

Figure 4B:
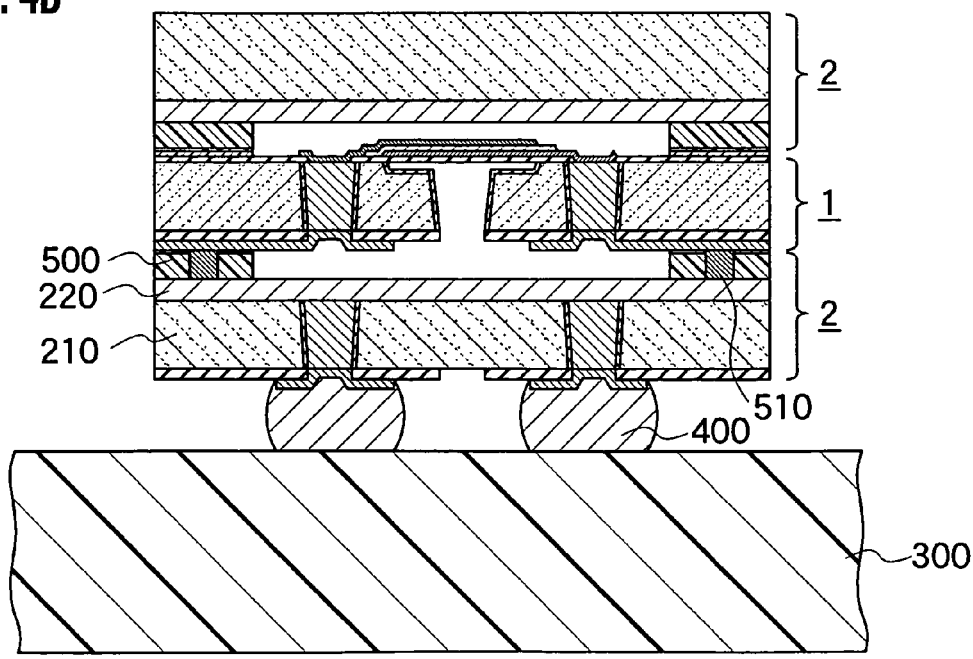

FIG. 4B shows an example of another stacked module of the MEMS chip 1 and the LSI chip 2, specifically an example of a stacked module in which the LSI chip 2 is laid as the lower layer, on which the MEMS chip is laid as the upper layer, on which another LSI chip 2 is laid, respectively with the spacer 500 interposed in-between. In this case, the space between the LSI chip 2 as the lower layer and the MEMS chip 1 arranged thereon can be sealed by the spacer 500 in the surrounding area. By this, the encapsulating resin can be blocked from passing through into the cavity 30C, which is assigned as the movable portion of the MEMS element A1. Consequently, the space for movement to the side of the cavity 30C of the MEMS element A1 can be secured for certain. With regard to the movable portion above the MEMS element A1, the resin can be blocked from passing through into the space between the MEMS chip 1 and the LSI chip 2, while carrying out the resin encapsulation, as in the case shown by FIG. 4A, by arranging another LSI chip 2 on the MEMS chip 1. Consequently, the upper movable portion of the MEMS element A1 can be also secured as the space for movement.

Thus, the MEMS chip 1 according to the first embodiment can be stacked with other circuit chips, such as the LSI chip 2. Since penetration of the encapsulating resin can be blocked by the spacer 500, the space produced between the chips by the stacking can be secured as the space for movement of the MEMS element. Note that there is no specific constrains on the order of the MEMS chip 1 and other circuit chips for the stacked structure. Moreover, the same effect can be obtained even if a plurality of MEMS chips 1 are stacked in layers.

In addition, although the LSI chip 2 was arranged above the MEMS chip 1 in the example of FIG. 4B, it is also possible to replace only the uppermost layer or a part of the stacked module with a hermetic seal. Moreover, as for the MEMS chip 1, the MEMS chip, which does not have the electric conduction plug shown in FIG. 3, can be also used.

Furthermore, with regard to the electric-wiring of each chip, the electric wiring of the upper and lower chips can be connected by forming a conductive plug 510 inside the spacer 500, as shown inside the spacer 500 as the lower layer in FIG. 4B. Consequently, the electrical connection between the MEMS chip 1 and the circuit board 300 can be also made through the electric conduction plug formed in the LSI chip 2. Other electric wiring methods can be suitably employed instead.

According to the stacked-module structure described above, since it is not necessary to use the conventional, expensive hermetic sealing or that its use is not limited, the cost can be significantly reduced.

It is noted that, although only a MEMS element is illustrated in the MEMS electronic components shown in FIG. 1 to FIG. 4B, the above-described structure and the manufacturing method can also be applied when a plurality of MEMS elements are provided. In addition, when a plurality of MEMS elements are arranged, an electrode of one of the two adjacent MEMS elements can be made a common electrode shared with the other MEMS element.

Second Embodiment

Figure 5:
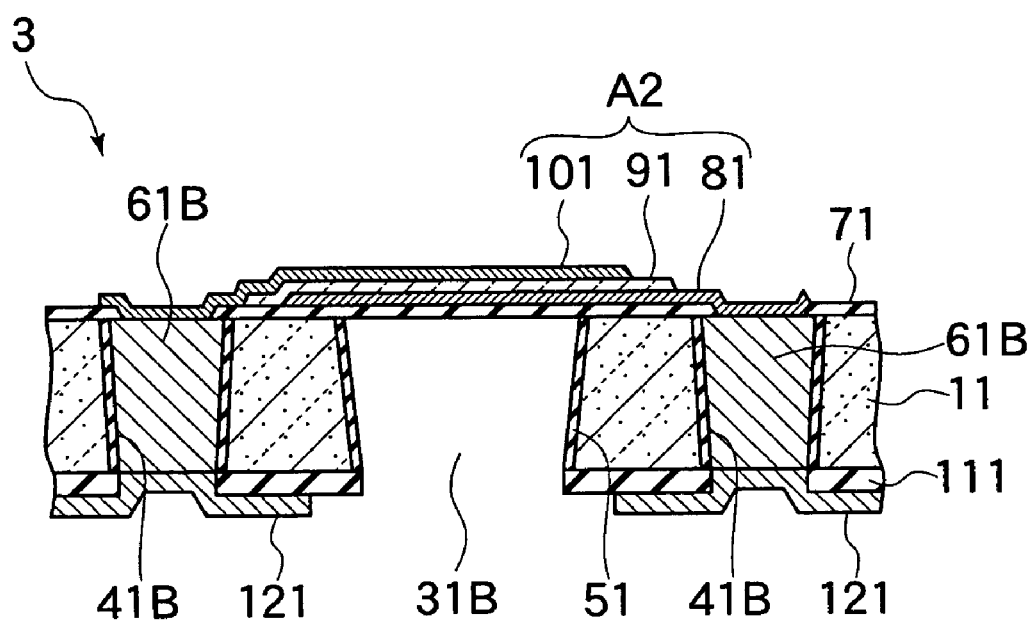
FIG. 5 is a cross sectional view showing a structure of an MEMS electronic component according to a second embodiment of the present invention.

A structure of a MEMS electronic component 3 according to the second embodiment is shown in FIG. 5.

As shown in this drawing, like the MEMS electronic component 1 according to the first embodiment, the MEMS electronic component 3 according to the second embodiment includes a MEMS element A2 with a movable portion on the upper surface of a silicon substrate 11. The MEMS electronic component 3 also includes a cavity 31B, which penetrates between the upper surface and the lower surface of the silicon substrate 11, in the region corresponding to the mechanical movable portion of the MEMS element A2. Further, the MEMS electronic component 3 includes an electric conduction plug 61B penetrating between the upper surface and the lower surface of the silicon substrate 11, which is assigned as a lead electrode of the MEMS element A2. The variations in structure from the MEMS electronic component 1 according to the first embodiment are as follows. First, unlike the first embodiment, the cavity 31B is not formed with the two cavities, the area of whose openings are different from each other, but formed by the cavity 31B having no steps. Second, the area of the opening of this cavity 31B is larger than the area of the opening of a through-hole 41B for the electric conduction plugs 61B that are formed at both sides. Thus, as is described hereinafter, the MEMS component can be manufactured in a simpler process by using the difference of the rate of etching trenches in direction of the depth of the substrate caused by the difference in the diameter size.

In addition, the MEMS electronic component 3 according to the second embodiment, like in the first embodiment, is formed by stacking a lower electrode 81, a piezo-electric film 91, and an upper electrode 101 on the upper surface of the silicon substrate 11, with an insulation film 71 interposed in-between. Conductive material is used for the lower electrode 81 and the upper electrode 101, each end of which is brought out to be connected with the electric conduction plug 61B. In addition, as for the specific material for each film, the same material as the MEMS electronic component according to the first embodiment can be used.

The inner wall surface of the cavity 31B is coated with an oxide film 51. The electric conduction plug 61B penetrates between the upper and lower sides of the silicon substrate 11, and is formed with a conductive material, which bury the inside of the through-hole 41B whose inner wall surface is coated with the oxide film 51. An electrode pad 121 is formed on each electric conduction plug 61B, which is exposed on the lower surface of the silicon substrate 11. In addition, the lower surface of the silicon substrate 11, except for the electrode pad 121 and the electric conduction plug 61B, are coated with an insulation film 111.

Next, with reference to FIGS. 6A to 6D, a method of manufacturing the MEMS electronic component 3 according to the second embodiment will be described. In addition, as for specific conditions of the steps common to the method of manufacturing the first embodiment, the same conditions as the first embodiment can be used.

Figure 6A:
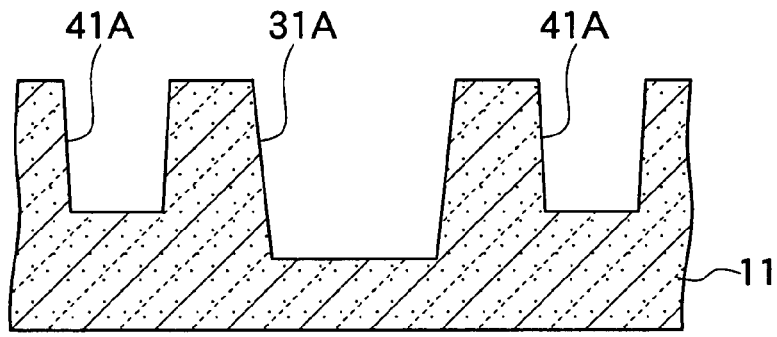
FIGS. 6A to 6D are cross sectional views showing each step of a method of manufacturing the MEMS electronic component according to the second embodiment of the present invention.

First, as shown in FIG. 6A, the silicon substrate 11 is prepared, and by using RIE, etc. using SF6 of a fluorine system gas, etc., a trench 31A having a sufficiently large area, such as a rectangular opening with one side of about 150 µm, against its movable portion is formed from the upper surface side in the region, where the movable portion of the MEMS element is to be formed by anisotropic etching. At the same time, a trench 41A having an opening of about 30 µm φ is formed in each position, where the electric conduction plug is formed. The trenches 31A and 41A each exhibits an etching shape, wherein the opening area becomes smaller in the depth direction, because of carrying out anisotropic etching. Moreover, although the trenches 41A and 31A each are etched simultaneously, since the both opening areas differ significantly, the etch rate in the trench 31A with a large opening area becomes faster than the one in the trench 41A with a smaller opening area, due to the so-called "loading effect". As a result, with the same etching time, the trench 31A is formed deeper than the trench 41A, as shown in FIG. 6A. The depth of the formed trench 41A is set to about 50 µm–200 µm, more preferably about 70 µm–100 µm. In addition, the difference in the etching depth obtained by the "loading effect" is preferably set to 5 µm or more. For example, if the opening of the trench 31A for the movable portion of the MEMS element is set to 100 ,,m square, the opening of the trench 41A for the electric conduction plug is set to 30 ,,m square. At this time, the difference in the trench depth of the two trenches 31A and 41A is 5 µm–10 µm.

Figure 6B:
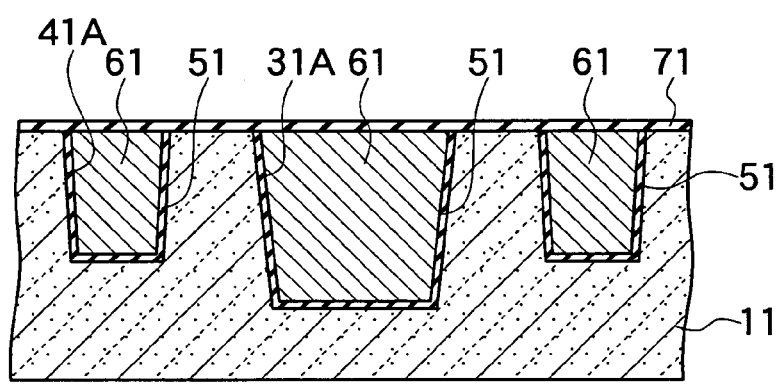

Next, an oxide film 51 is formed on the inner wall surface of the trench 41A and trench 31A using a thermal-oxidation method. Then, the trenches 31A and 41A each are buried with an electric conduction film 61, such as Cu. Then, the upper surface of the substrate is planarized using a CMP method, and further an insulation film 71 is formed on the upper surface of the substrate using a CVD, etc. Thus, a structure shown in FIG. 6B is obtained.

Figure 6C:
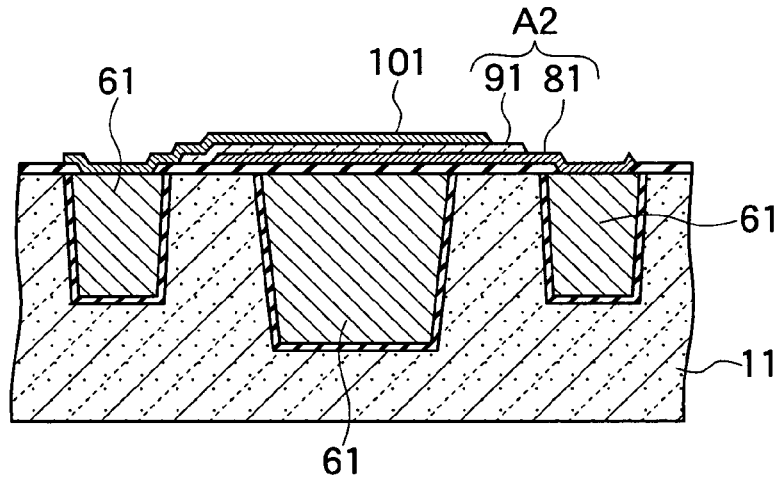

Then, as shown in FIG. 6C, the MEMS element A2 is formed on the upper surface of the silicon substrate 11 through the same procedure as the first embodiment. A piezo-electric film 91 is sandwiched by the lower electrode 81 and the upper electrode 101, and the lower electrode 81 is electrically connected to the electric conduction film 61 that is buried in one of trench 41A, while the upper electrode 101 is electrically connected to the electric conduction film 61 that is buried in the other trench 41A.

Next, the silicon substrate 11 is ground from the side of the lower surface, until the electric conduction film 61 buried in the trench 31A is exposed. Since the trench 31A is deeper than the trench 41A due to the above described "loading effect", only the electric conduction film 61 buried in the trench 31A can be selectively exposed.

Figure 6D:
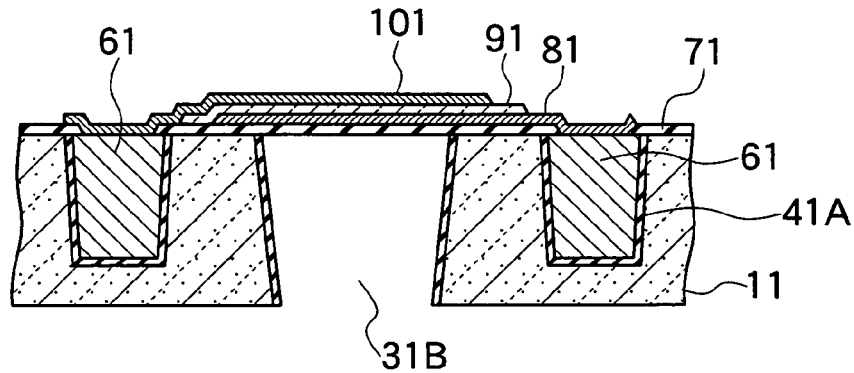

Next, the electric conduction film 61 buried in the trench 31A is removed by a wet etching to form the cavity 31B, thus obtaining a structure shown in FIG. 6D. In addition, the electric conduction film 61 buried in each trench 41A is not exposed and will remain inside the substrate 11. Thus, with the manufacturing method according to the second embodiment, the trench 31A is formed deeper than the trench 41A using the "loading effect" due to the difference in diameter of the trenches, and thus only the electric conduction film 61 buried in the trench 31A can be selectively exposed by grinding the substrate. Therefore, a special patterning step for etching only the electric conduction film 61 inside the trench 31A will be unnecessary, thereby enabling simplification of the process.

Then, further, the silicon substrate 11 is ground from the side of the lower surface to expose the electric conduction film 61, which is buried in the trench 41A and makes each trench 41A a through-hole 41B that penetrates the upper surface and the lower surface of the substrate. Next, through the same procedure as the first embodiment, while an insulation film is formed on the lower surface of the substrate, the electric conduction film 61 portion is exposed by patterning, and further the MEMS electronic component 3 shown in a FIG. 5 can be obtained by forming the electrode pad 121 on the electric conduction film 61.

With the MEMS electronic component 3 according to the second embodiment described above, since the trench required for the space for movement of the MEMS element is formed from the side of the upper surface of the substrate by etching, like in the case in the MEMS electronic component according to the first embodiment. Therefore, the space for mechanical movement of the MEMS element can be secured more precisely and without forming a large cavity more than necessary, thus the mechanical strength of the silicon substrate 11 is kept. Moreover, since the electric conduction plug 61B is formed in the concurrent step, the electrical connection with a circuit board can be made using a bump instead of a wire bonding. Accordingly, when using the piezoelectric device as an RF-MEMS element that uses an RF signal, the influence of noise can be suppressed and the performance of the element can be improved, while a more compact stacked module can be manufactured. Furthermore, in a method of manufacturing the MEMS electronic component 3 according to the second embodiment, as described above, when selectively removing the buried Cu from the lower surface of the substrate, only the region, which need to be removed, can be exposed without patterning. Thus, the process of the first embodiment can be simplified more.

In addition, even in the first embodiment, if the shallow trench 20, which is to be formed in advance, is formed with a depth of 5 μm or more, a difference will arise in the position of the etching bottom, even when the diameter of the trench 30A is the same as the diameter of the trench 40A. Accordingly, only the electric conduction film 60 in the trench 30A can be exposed by the process of grinding from the lower surface of the substrate, like in the manufacturing method according to the second embodiment.

Furthermore, also in the MEMS electronic component 3 according to the second embodiment, a structure omitting the electric conduction plug 61B can be employed as required, like in the MEMS electronic component 1 according to the first embodiment, while a module structure, which is stacked with other circuit chips and integrated as shown in FIG. 4A and FIG. 4B, can be employed.

Third Embodiment

The third embodiment is a modification of the second embodiment. Although the structure of the MEMS electronic component has almost the same structure as the one shown in FIG. 5, the space for movement for the MEMS element and the subsequent trench formation step of forming the cavity portion are different.

Figure 7A:
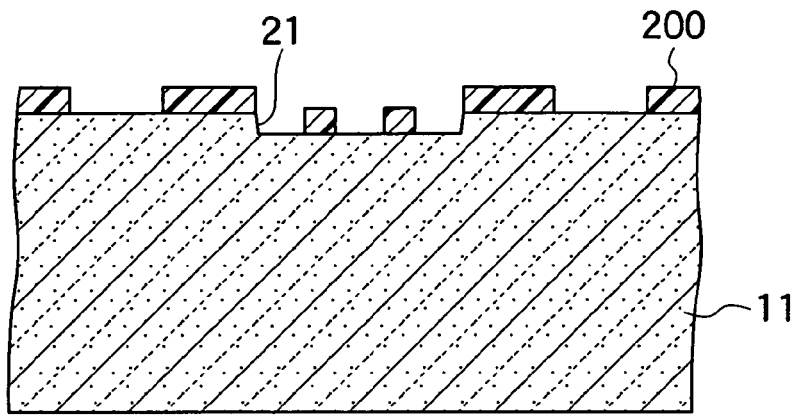
FIGS. 7A and 7B are cross sectional views showing steps of forming a trench in a MEMS electronic component according to a third embodiment of the present invention.
Figure 7B:
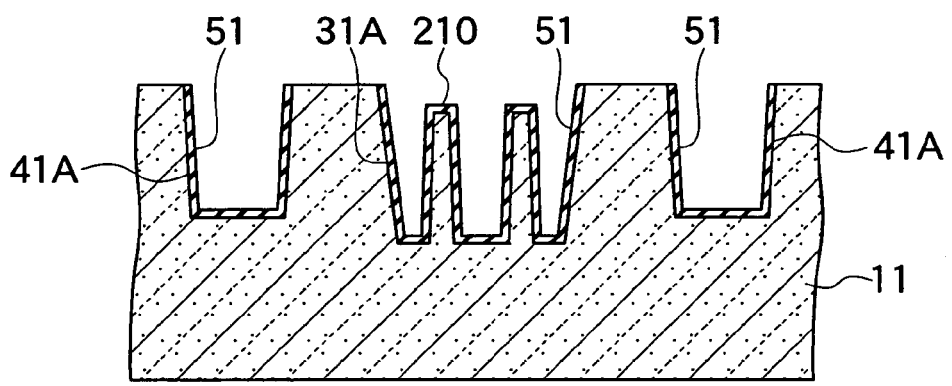

Steps of manufacturing the trench 31A, which is the characterizing portion according to the third embodiment, is shown in FIG. 7A and FIG. 7B. In addition, FIG. 7A and FIG. 7B show cross sectional views at 7B—7B line of a plan view shown in FIG. 7C.

As shown in FIG. 7A, a shallow trench 21 is formed for securing the space for movement of the MEMS element in the silicon substrate 11. Next, resist 200 is patterned to form an etching mask, and an etching residual pattern 210 in the shape of a convex is formed in the trench 31A using this etching mask, as shown in FIG. 7B. With the presence of this etching residual pattern 210 in the shape of a convex, the amount of the electric conduction film required for burying can be reduced significantly in the subsequent step of burying the trench 31A with the electric conduction film. Moreover, the time required for burying can be also reduced, thereby enabling reduction of the process cost.

Figure 7C:
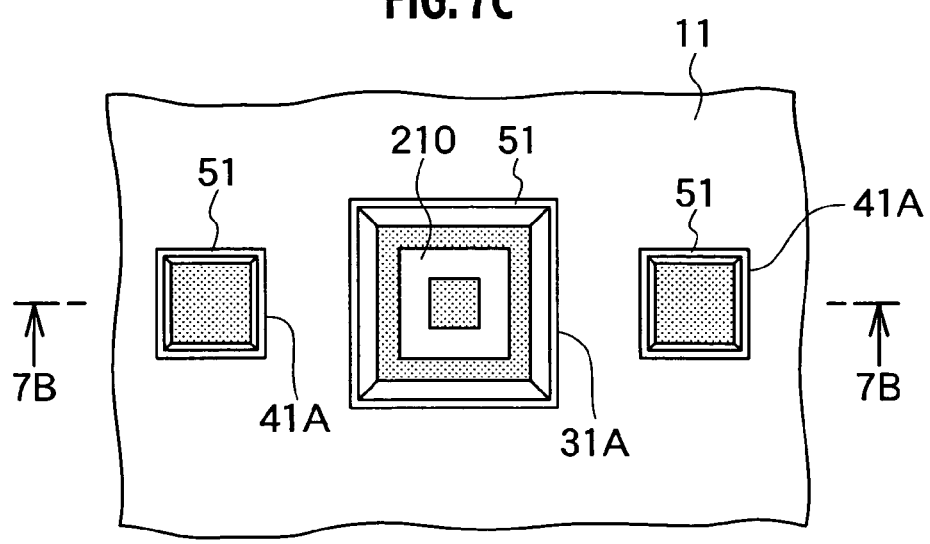
FIG. 7C is a planar view of FIG. 7B.
Figure 8:
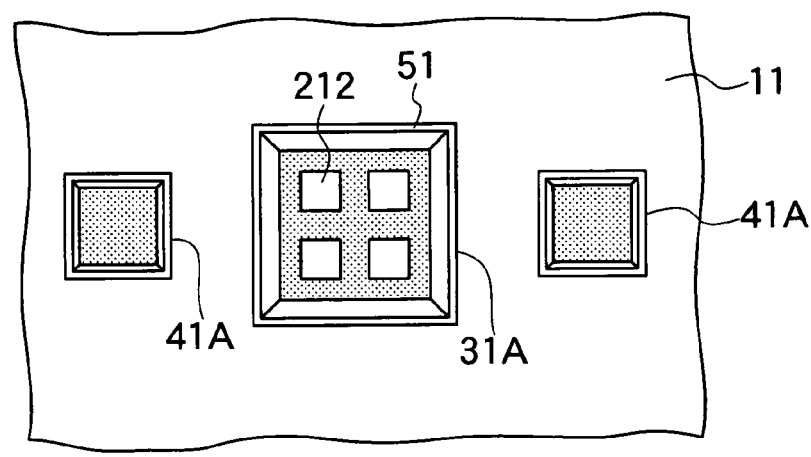
FIG. 8 is a planar view showing a step of forming a trench in an example of a modification in the method of manufacturing the MEMS electronic component according to the third embodiment of the present invention.

FIG. 8 is a plan view showing a modification example, which has the same effect as in the manufacturing process shown in FIGS. 7A–7C, of the etching residual pattern in the trench. In FIG. 8, as the etching residual pattern, four pillar-shaped patterns 212 are formed. The amount of the electric conduction film required for burying and the time required for burying can be significantly reduced in this case also, like in the etching residual pattern 210, thereby enabling reduction of the process cost.

In addition, these etching residual patterns are removed at the same time when etching the buried electric conduction film in the trench 31A.

In addition, the etching residual pattern formed in the trench 31A is not limited to these patterns, but various patterns can be employed as long as these are effective in limiting the buried amount in the trench 31A.

Figure 9A:
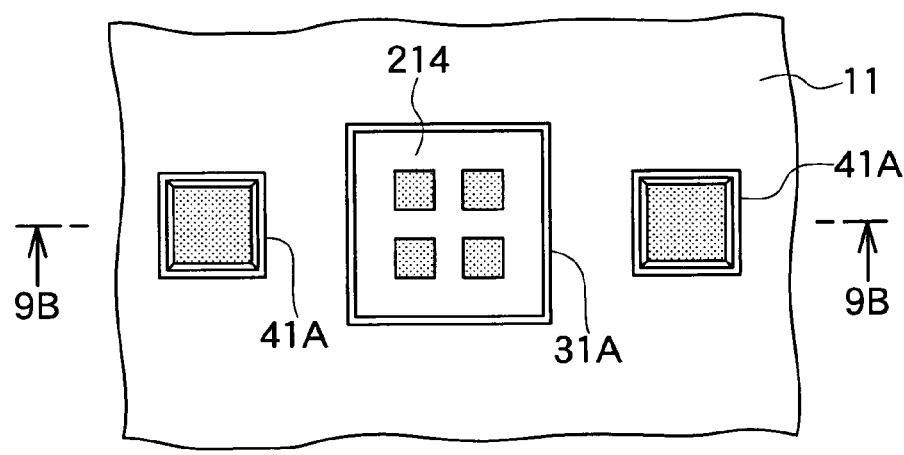
FIG. 9A is a planar view showing a step of forming a trench in an another example of a modification in the method of manufacturing the MEMS electronic component according to the third embodiment of the present invention.
Figure 9B:
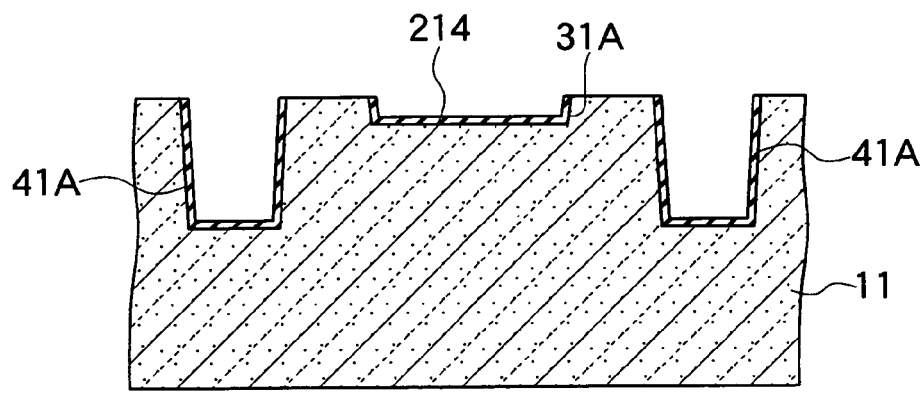
FIG. 9B is a cross sectional view of the MEMS electronic component in the step of forming a trench shown in FIG. 9A.

FIG. 9A and FIG. 9B are examples showing another etching residual pattern formed in the trench 31A. In addition, FIG. 9B shows a sectional view at 9B—9B line of a plan view shown in FIG. 9A.

Here, as shown in FIG. 9A, a pattern having a cruciform plane pattern is formed as the etching residual pattern. Thus, by forming the pattern that is partly connected to the silicon substrate 11 of the inner wall portion of the trench, an etching residual pattern 214 can be left after etching the electric conduction film buried in the trench 31A. Since the remaining pattern, as a support material, has a function to reinforce the cavity, the strength of the silicon substrate 11 can be strengthened more.

Fourth Embodiment

A MEMS electronic component according to the fourth embodiment is the MEMS electronic component, which can be used as an inertia sensor for detecting various dynamic environment, such as acceleration, inclination, impact, torque, and motion. A perspective view of the MEMS electronic component according to the fourth embodiment is shown in FIG. 10A.

Four MEMS elements A3 formed on a chip having, for example, a rectangular plane shape are respectively arranged on the axes, which go toward the center point from the center of each four sides of the chip, and a cavity 35B is formed in the shape of frame as viewed from the lower surface of the chip, which has a rectangular plane shape. Each MEMS element A3 is formed such that a movable portion thereof is arranged above the cavity 35B. Thus, when arranging a plurality of MEMS elements A3 on a single chip, a continuing cavity may be formed by the plurality of MEMS elements A3. However, in order to keep the strength of the chip more strongly, the cavity volume preferably is as small as possible, and an independent separated cavity may be formed for each MEMS element.

Figure 10A:
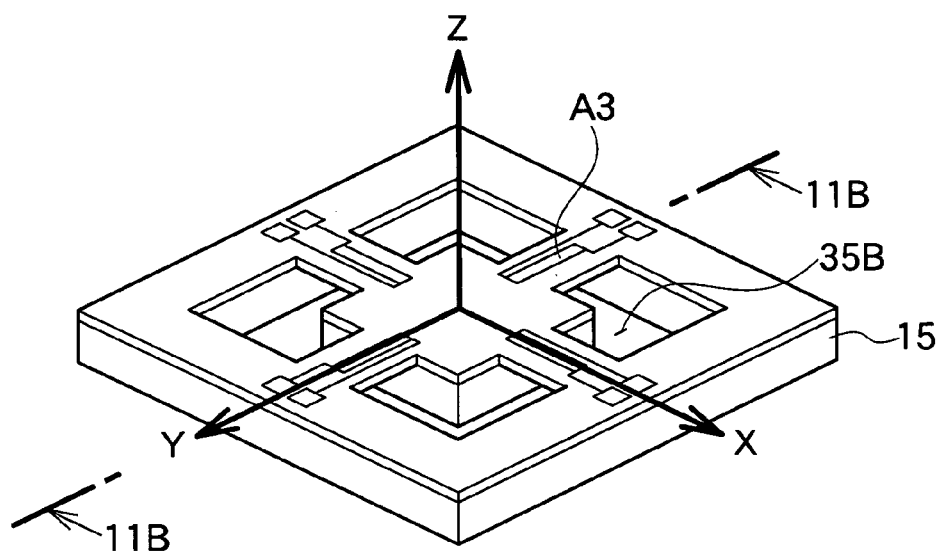
FIG. 10A is a perspective view of an MEMS electronic component according to a fourth embodiment of the present invention.

In addition, in the MEMS electronic component shown in FIG. 10A, an example of forming electrode pads on the upper surface of a silicon substrate 15 instead of forming electric conduction plugs, however, as for the leads for the electrodes of the MEMS elements, the electrode terminals may be formed on the lower surface of the silicon substrate by forming electric conduction plugs, like in the MEMS electronic components according to the first and second embodiments.

Figure 10B:
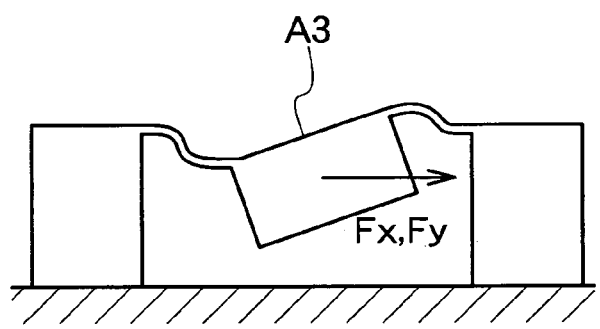
FIGS. 10B and 10C are schematic diagrams showing the movement of an MEMS element.
Figure 10C:
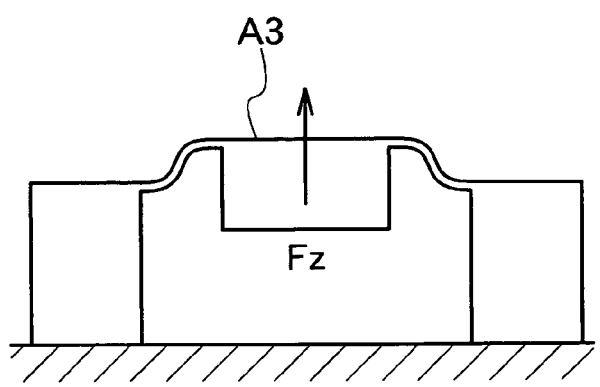

FIG. 10B and FIG. 10C are schematic diagrams showing a relationship of the direction of an inertia force and deformation of the MEMS element A3. In the MEMS element A3, when an inertia force acts in the XY-direction or the Z-direction, as shown in FIG. 10B and FIG. 10C, a deformation will be produced to the piezoelectric device in response to this force and this deformation amount is grasped as a potential difference. The inertia sensor shown in FIG. 10A detects the force (Fx, Fy, Fz) acted in each XYZ-directions based on the measurement values obtained from the four MEMS elements A3.

In addition, although an example of arranging four MEMS elements on a chip is shown in FIG. 10A, the count of the MEMS elements arranged on a single chip is not particularly limited.

Figure 11A:
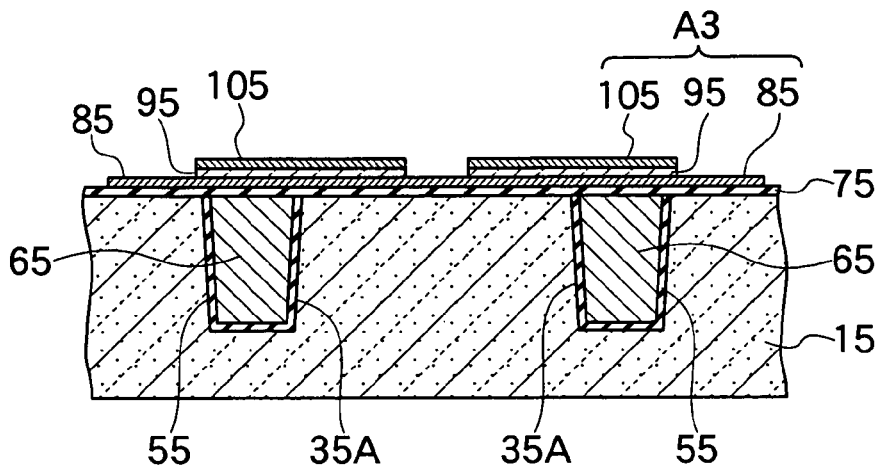
FIGS. 11A to 11C are cross sectional views showing each step of the method of manufacturing the MEMS electronic component according to the fourth embodiment of the present invention.
Figure 11B:
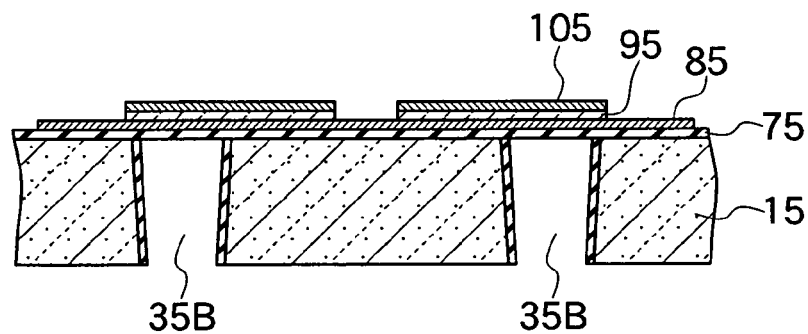
Figure 11C:
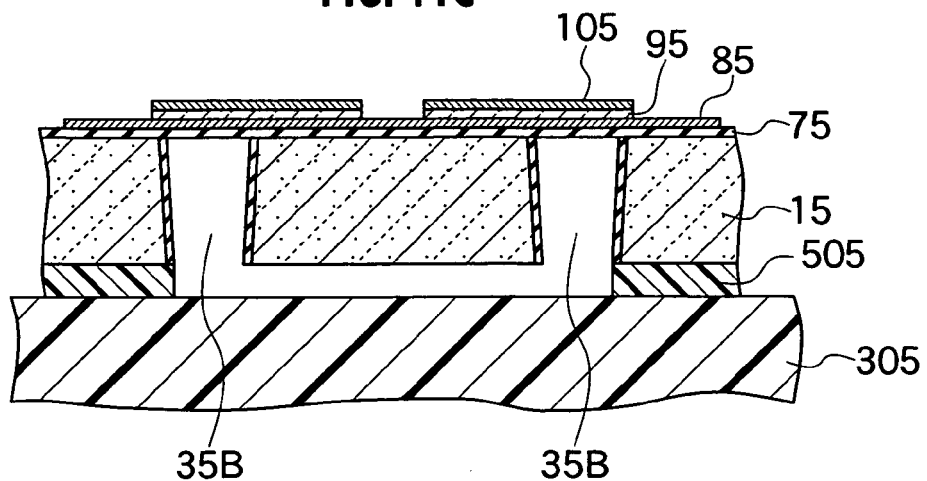

FIG. 11A to FIG. 11C are process drawings showing a method of manufacturing the MEMS electronic component according to the fourth embodiment. The fundamental manufacturing method is the same as that of the manufacturing method according to the first embodiment. First, a trench 35A is formed in the silicon substrate 15. Next, an oxide film 55 is formed on the inner wall surface of the trench 35A using a thermal oxidation. Then, the trench 35A is buried with a sacrifice film 65, such as Cu, then after planarizing the silicon surface of the substrate, an insulation film 75 is formed on the upper surface of the substrate by a CVD, etc. Then, a lower electrode 85, a piezo-electric film 95, and a pattern of an upper electrode 105 are formed sequentially from the bottom on the insulation film 75.

Continuously, as shown in FIG. 11B, the sacrifice film 65 buried into each trench 35A is exposed by grinding from the lower surface of the silicon substrate 15, and further, the exposed sacrifice film 65 is removed by etching to form a cavity 35B. In addition, in this case, the sacrifice film material used for burying the trench 35A is not limited to a conductive film, but may be an insulation film as long as the material has a high etching selectivity to the silicon substrate and is easily etched. With respect to the other specific manufacturing conditions, the same conditions as the first embodiment can be used.

Furthermore, when mounting on a circuit board 305, etc., it is effective to fix on the circuit board 305 using a fixing material 505, such as a resin or a metal paste that has adhesiveness.

As shown in the above described method, it is not necessary to carry out the formation of the cavity, which becomes the space for movement of the MEMS element, at the same time of the formation of the electric conduction plug, and the formation may be carried out independently. Also in this case, since the trench formed by carrying out etching from the upper surface of the silicon substrate is eventually used as the cavity, the cavity can be arranged precisely at the movable portion of the MEMS element. Further, with regard to the cavity, the opening in the side of the upper surface of the substrate is larger than the opening in the side of the lower surface of the substrate can be formed. Therefore, the strength of the silicon substrate can be kept without forming a large cavity more than necessary.

In addition, the MEMS electronic component shown in FIG. 10A can be used as an inertia sensor with a high precision by forming a plurality of MEMS elements on a chip.

Other Embodiments

In the fourth embodiment, an example of the MEMS electronic component, which can be used as an inertia sensor, is shown. The MEMS electronic components shown in the first to third embodiments can also be used as the other sensors.

For example, the MEMS electronic component using the piezoelectric device can be used as a flow rate sensor of gas, liquid, etc. This is because the piezo-electric film deforms to produce distortion by the force received from fluid, thereby producing a voltage change in response to the distortion amount. In this case, the MEMS electronic component is arranged in a position contacting to the fluid. With respect to the position relationship between the fluid and the electronic component, the liquid may be provided, for example, from the above of the silicon substrate 10 to the surface of the piezoelectric device by a down flow as shown in FIG. 1, or provided from the lower surface of the silicon substrate 10 to the lower surface of the piezoelectric device through the cavity 30C, as shown in FIG. 3.

Moreover, the MEMS electronic component using the piezoelectric device can be also used as an infrared sensor, because the piezo electric material such as PZT has a pyroelectric effect. When used as an infrared sensor, the infrared sensor is arranged such that an infrared ray may be irradiated to the piezoelectric device. The infrared ray may be irradiated to the piezoelectric device, like in the case of the flow rate sensor, from the above almost vertical to the silicon surface of the substrate where the piezoelectric device is formed. On the contrary, the infrared ray may be irradiated, from bottom upwardly, from the side of the lower surface of the silicon substrate through the cavity toward the piezoelectric device.

In addition, when using the MEMS electronic components according to the first to the third embodiments as the infrared sensor, the presence of the cavity, which is formed for the space for movement of the piezoelectric device and penetrates the substrate, reduces the heat capacity of the piezoelectric device and makes the piezoelectric device sensitive to temperature changes, and a sensor having a high sensitivity can be thus obtained.

Moreover, if piezoelectric devices are arranged in a two-dimensional array, the infrared image sensor also can be manufactured. In addition, for the case where the electric conduction plug shown in FIG. 1 is provided, since the electrode are brought out to the lower surface of the silicon substrate and thus the surface of the silicon substrate can be used more effectively for arranging the piezoelectric devices, the MEMS electronic component can be used as an infrared sensor having a high sensing precision.

Furthermore, the MEMS electronic components using the piezoelectric device according to the first to the third embodiments can be used also as an acoustics sensor, an oscillator, a resonator, a surface-acoustic-wave (SAW) filter, and an ultrasonic transducer. When used as an acoustics sensor, there is no specific constrains regarding the providing direction of the acoustic wave. For the audio-range frequency, it can be used as a microphone, a stethoscope, and an artificial ear. Moreover, when used as an oscillation source, it can be used as a small loudspeaker. Furthermore, when carrying out oscillation and reception of the sound in the ultrasonic wave range, it can be also used as an ultrasonic diagnosis probe if the piezoelectric devices are arranged in two dimensions. Moreover, when used as an FBAR, it can apply, as a precise frequency filter, also to the application of a cellular phone, etc.

The examples using the piezoelectric device mainly as the MEMS element have been described in the first to fourth embodiments, but the MEMS element according to the present embodiments includes at least a mechanical movable portion, and can be applicable not only to the piezoelectric device but also to any device which requires a space for movement. For example, it is applicable to a micro-actuator that utilizes the operation principle of static electricity, a shape memory alloy, thermal expansion, an electromagnetic force, etc., in addition to the piezoelectric device. Therefore, the electronic component according to the present invention can be used as not only the various sensors, a resonator, and a filter, as described above, but also as a switch, a variable capacitor, etc.

As described above, although the electronic components, the electronic component modules, and their manufacturing methods of the present invention have been described according to the embodiments of the present invention, the electronic components and the manufacturing methods of the present invention are not limited to the above description, and it is obvious to those skilled in the arts that various modifications can be made.

In the electronic component according to the first embodiment of the present invention, since there are provided the electric conduction plug as well as the cavity that becomes the space for movement of the electrical mechanical element, the formation of the module, which does not use bonding wires, can be made, while stacking with other circuits is simplified. Moreover, since the cavity and the electric conduction plug can be manufactured using the common trench formation process, the size of the cavity can be controlled more accurately, and further, the size of the cavity can be restricted, and the strength of the semiconductor substrate can be thus kept.

Moreover, according to the electronic component module according to the second embodiment of the present invention, stacking with other circuits can be achieved, while since the space produced by the spacer, which is arranged between other circuit chips and the MEMS component, can be utilized as the space for movement of the MEMS element, an inexpensive stacked module can be provided by avoiding or limiting the use of an expensive hermetic sealing.

Furthermore, according to the manufacturing method of the electronic component according to the third embodiment of the present invention, the trench is formed from the side of the upper surface of the substrate in the semiconductor substrate and then forming a cavity in the trench. Therefore, the cavity can be thus utilized as the space for the movable portion of the electrical mechanical element, and the space for the movable portion is secured with a sufficient controllability. Further, since the opening area at the side of the upper surface of the substrate can be made smaller than the opening area at the lower surface of the substrate, the size of the cavity is restricted and the mechanical strength of the semiconductor substrate can be thus maintained.

What is claimed is:

1. An electronic component module comprising:
an electronic component including:
a semiconductor substrate having a first surface and a second surface opposite to the first surface;
a cavity that has an opening penetrating from the first surface to the second surface of the semiconductor substrate;
an electrical mechanical element which has a movable portion, and which is formed above the first surface of the semiconductor substrate so that the movable portion is arranged above the cavity; and
an electric conduction plug which penetrates from the first surface to the second surface of the semiconductor substrate and is electrically connected to the electrical mechanical element; and
a circuit chip stacked on the electronic component with a spacer interposed in-between.

2. The electronic component according to claim 1, wherein in the cavity, an area of the opening at the first surface of the semiconductor substrate is larger than an area of the opening at the second surface of the semiconductor substrate.

3. The electronic component according to claim 2, wherein the cavity includes a first cavity region on a side of the first surface of the semiconductor substrate and a second cavity region on a side of the second surface of the semiconductor substrate, and the first cavity region has a maximum opening area which is at least larger than the movable portion and the second cavity region has a maximum opening area which is at least smaller than the maximum opening area of the first cavity region.

4. The electronic component according to claim 1, wherein the cavity is provided with a support material which is connected to the semiconductor substrate.

5. The electronic component according to claim 1, wherein the electronic component is one electronic component selected from the group consisting of a resonator, a filter, a switch, a variable condenser, a variable inductor, a pressure sensor, an acceleration sensor, and an actuator.

6. The electronic component according to claim 1, wherein the electrical mechanical element is a piezoelectric device.

7. The electronic component according to claim 6, wherein the electrical mechanical element comprises a first electrode, a second electrode, and a piezo-electric film that is sandwiched between the first and second electrodes.

8. The electronic component according to claim 6, wherein the piezoelectric device is one sensor selected from the group consisting of an inertia sensor, a pressure sensor, a flow rate sensor, an infrared sensor, and an acoustics sensor.

9. The electronic component module comprising:
a circuit board including a wiring pattern;
An electronic component including:
a semiconductor substrate having a first surface and a second surface opposite to the first surface;
a cavity that has an opening penetrating from the first surface to the second surface of the semiconductor substrate;
an electrical mechanical element which has a movable portion, and which is formed above the first surface of the semiconductor substrate so that the movable portion is arranged above the cavity; and
an electric conduction plug which penetrates from the first surface to the second surface of the semiconductor substrate and is electrically connected to the electrical mechanical element;
an electric conduction bump which electrically connects the electric conduction plug of the electronic component to the wiring pattern of the circuit board, and which is arranged between the electronic component and the circuit board;
a spacer arranged on the first surface of the semiconductor substrate where the electrical mechanical element of the electronic component is formed; and a circuit chip which is stacked on the electronic component with the spacer interposed in-between.

10. The electronic component according to claim 9, wherein in the cavity, an area of the opening at the first surface of the semiconductor substrate is larger than an area of the opening at the second surface of the semiconductor substrate.

11. The electronic component according to claim 10. wherein the cavity includes a first cavity region on a side of the first surface of the semiconductor substrate and a second cavity region on a side of the second surface of the semiconductor substrate, and the first cavity region has a maximum opening area which is at least larger than the movable portion and the second cavity region has a maximum opening area which is at least smaller than the maximum opening area of the first cavity region.

12. The electronic component according to claim 9, wherein the cavity comprises a support material which is connected to the semiconductor substrate.

13. The electronic component according to claim 9, wherein the electronic component is a component selected from the group consisting of a resonator, a filter, a switch, a variable condenser, a variable inductor, a pressure sensor, an acceleration sensor, and an actuator.

14. The electronic component according to claim 9, wherein the electrical mechanical element is a piezoelectric device.

15. The electronic component according to claim 14, wherein the electrical mechanical element comprises a first electrode, a second electrode, and a piezo-electric film that is sandwiched between the first and second electrodes.

16. The electronic component according to claim 14, wherein the piezoelectric device is a sensor selected from the group consisting of an inertia sensor, a pressure sensor, a flow rate sensor, an infrared sensor, and an acoustics sensor.

* * * * *